(12) United States Patent
Andersson et al.

(10) Patent No.: US 11,513,446 B2
(45) Date of Patent: Nov. 29, 2022

(54) ADAPTIVE ALIGNMENT

(71) Applicant: ASML Holding N.V., Veldhoven (NL)

(72) Inventors: Greger Göte Andersson, Redding, CT (US); Krishanu Shome, Cheshire, CT (US); Zahrasadat Dastouri, Stamford, CT (US); Igor Matheus Petronella Aarts, Port Chester, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/297,691

(22) PCT Filed: Nov. 26, 2019

(86) PCT No.: PCT/EP2019/082502
§ 371 (c)(1),
(2) Date: May 27, 2021

(87) PCT Pub. No.: WO2020/114829
PCT Pub. Date: Jun. 11, 2020

(65) Prior Publication Data
US 2021/0397103 A1 Dec. 23, 2021

Related U.S. Application Data

(60) Provisional application No. 62/775,780, filed on Dec. 5, 2018.

(51) Int. Cl.
*G03F 9/00* (2006.01)
*G03F 7/20* (2006.01)

(52) U.S. Cl.
CPC ........ *G03F 9/7069* (2013.01); *G03F 7/70633* (2013.01); *G03F 9/7088* (2013.01); *G03F 9/7092* (2013.01)

(58) Field of Classification Search
CPC .. G03F 9/7069; G03F 7/70633; G03F 9/7088; G03F 9/7092; G03F 7/70483; G03F 7/70491
See application file for complete search history.

(56) References Cited

U.S. PATENT DOCUMENTS

| | | | |
|---|---|---|---|
| 6,064,486 | A | 5/2000 | Chen et al. |
| 2015/0227061 | A1 | 8/2015 | Tinnemans et al. |

(Continued)

OTHER PUBLICATIONS

Ole Andersen, European International Searching Authority, International Search Report and Written Opinion, corresponding PCT Application No. PCT/EP2019/082502, dated Apr. 3, 2020, 10 pages total.

*Primary Examiner* — Steven Whitesell Gordon
*Assistant Examiner* — Steven H Whitesell-Gordon
(74) *Attorney, Agent, or Firm* — DiBerardino McGovern IP Group LLC

(57) ABSTRACT

A method of applying a measurement correction includes determining an orthogonal subspace used to characterize a first principal component of the measurement and a second principal component of the measurement, and rotating the orthogonal subspace by a first angle such that the first principle component rotates to become a first factor vector and the second principle component rotates to become a second factor vector. An asymmetry vector is generated by rotating the second factor vector by a second angle, where the asymmetry vector and the first factor vector define a non-orthogonal subspace. An asymmetry contribution is determined in the measurement based on the projection of the measurement onto the first factor vector in the non-orthogonal subspace. The method also includes subtracting the asymmetry contribution from the measurement.

21 Claims, 10 Drawing Sheets

(56) References Cited

U.S. PATENT DOCUMENTS

2016/0246185 A1\* 8/2016 Ypma ................ G03F 7/70633
2019/0094721 A1 3/2019 Tinnemans et al.

\* cited by examiner

ADAPTIVE ALIGNMENT

CROSS-REFERENCE TO RELATED APPLICATIONS

This application claims priority of U.S. Provisional Patent Application No. 62/775,780, which was filed on Dec. 5, 2018, and which is incorporated herein in its entirety by reference.

FIELD

The present disclosure relates to metrology systems that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use a metrology system for detecting positions of the alignment marks (e.g., X and Y position) and for aligning the substrate using the alignment marks to ensure accurate exposure from a mask. The metrology system may be used to determine a height of a wafer surface in the Z direction. Any asymmetry present in the alignment marks makes it challenging to accurately align the substrate. Conventional alignment techniques are typically not capable of removing unwanted effects due to mark asymmetry.

SUMMARY

Accordingly, there is a need for improving metrology systems to perform better wafer alignment by removing unwanted effects due to mark asymmetry.

According to an embodiment, a metrology system includes a radiation source that generates light, a reflector, an interferometer, a detector, and a controller. The reflector directs the light towards a substrate. The interferometer interferes the light that has been diffracted from a pattern on the substrate, or reflected from the substrate, and produces output light from the interference. The detector receives the output light from the interferometer and produces a measurement based on the received output light. The controller determines a correction to the measurement. The determination includes determining an orthogonal subspace used to characterize a first principal component of the measurement and a second principal component of the measurement, and rotating the orthogonal subspace by a first angle such that the first principle component rotates to become a first factor vector and the second principle component rotates to become a second factor vector. The controller also generates an asymmetry vector by rotating the second factor vector by a second angle, where the asymmetry vector and the first factor vector define a non-orthogonal subspace. The controller determines an asymmetry contribution in the measurement based on the projection of the measurement onto the first factor vector in the non-orthogonal subspace, and subtracts the asymmetry contribution from the measurement.

In another embodiment, a lithographic apparatus includes an illumination system designed to illuminate a pattern of a patterning device, a projection system that projects an image of the pattern onto a target portion of a substrate, and a metrology system. The metrology system includes a radiation source that generates light, a reflector, an interferometer, a detector, and a controller. The reflector directs the light towards a substrate. The interferometer interferes the light that has been diffracted from a pattern on the substrate, or reflected from the substrate, and produces output light from the interference. The detector receives the output light from the interferometer and produces a measurement based on the received output light. The controller determines a correction to the measurement. The determination includes determining an orthogonal subspace used to characterize a first principal component of the measurement and a second principal component of the measurement, and rotating the orthogonal subspace by a first angle such that the first principle component rotates to become a first factor vector and the second principle component rotates to become a second factor vector. The controller also generates an asymmetry vector by rotating the second factor vector by a second angle, where the asymmetry vector and the first factor vector define a non-orthogonal subspace. The controller determines an asymmetry contribution in the measurement based on the projection of the measurement onto the first factor vector in the non-orthogonal subspace, and subtracts the asymmetry contribution from the measurement.

In yet another embodiment, a method of applying a measurement correction includes determining an orthogonal subspace used to characterize a first principal component of the measurement and a second principal component of the measurement, and rotating the orthogonal subspace by a first angle such that the first principle component rotates to become a first factor vector and the second principle component rotates to become a second factor vector. An asymmetry vector is generated by rotating the second factor vector by a second angle, where the asymmetry vector and the first factor vector define a non-orthogonal subspace. An asymmetry contribution is determined in the measurement based on the projection of the measurement onto the first factor vector in the non-orthogonal subspace. The method also includes subtracting the asymmetry contribution from the measurement.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
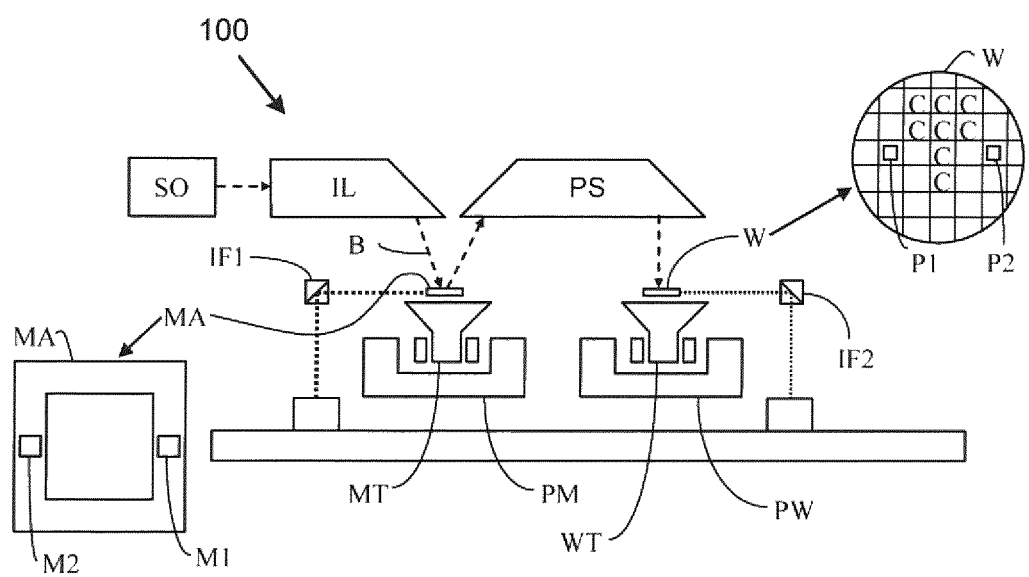
FIG. 1A is a schematic illustration of a reflective lithographic apparatus according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
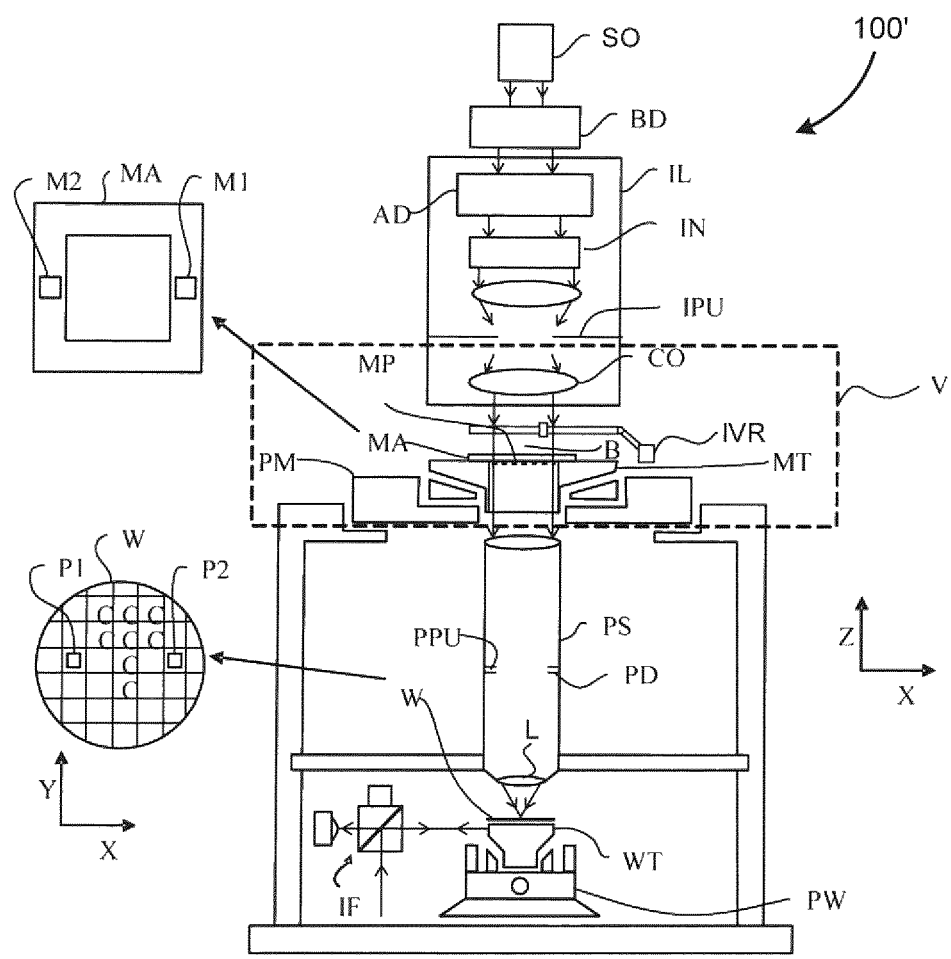
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
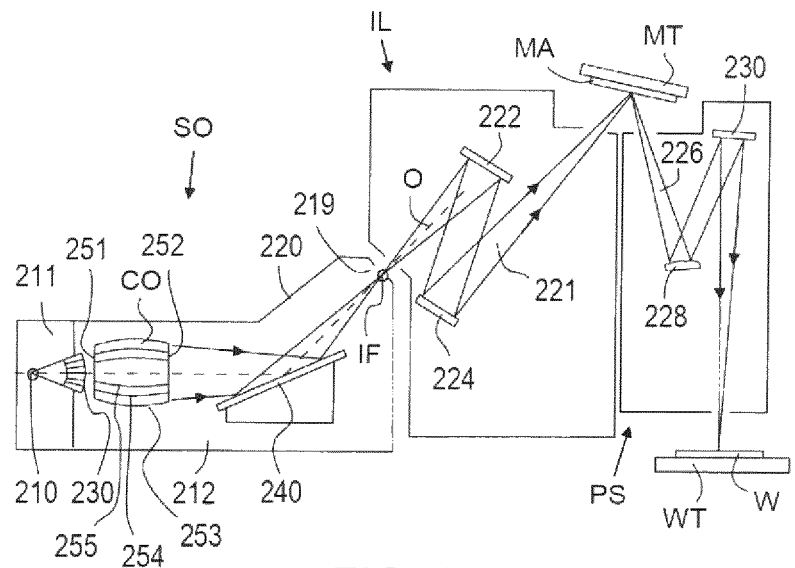
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGS., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
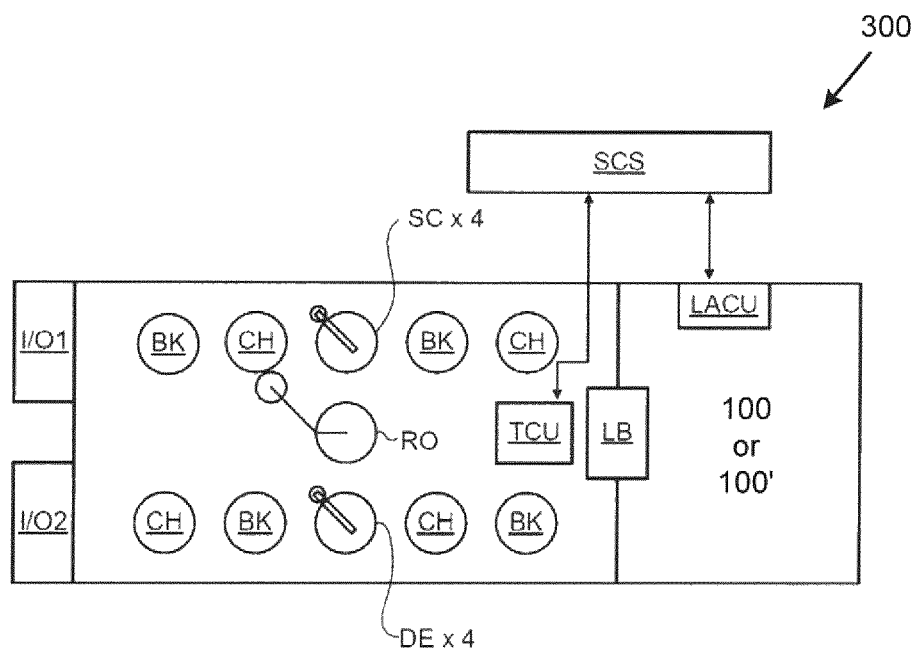
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1,I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Metrology System

Figure 4:
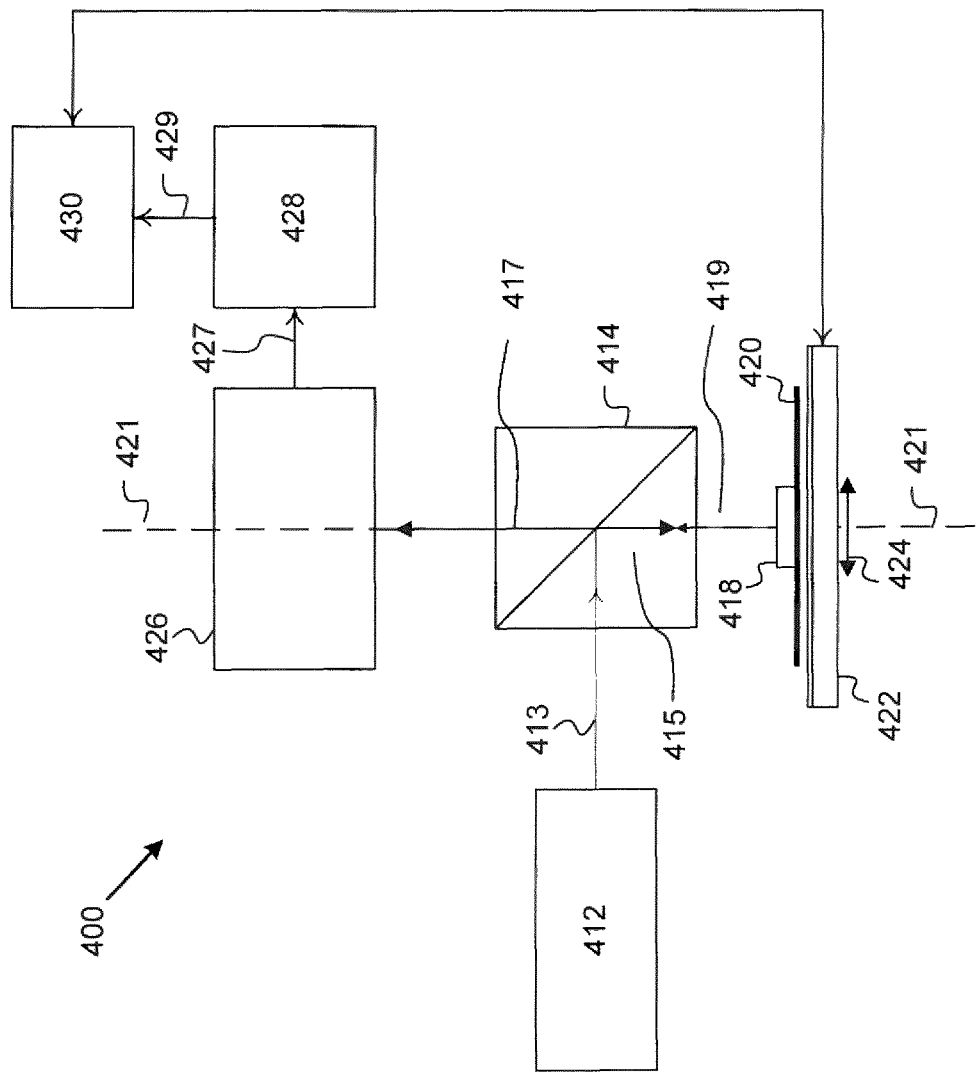
FIG. 4 is a schematic illustration of a metrology system, according to an embodiment.

FIG. 4 illustrates a schematic of a cross-sectional view of a metrology system 400 that can be implemented as a part of lithographic apparatus 100 or 100', according to an embodiment. In an example of this embodiment, metrology system 400 may be configured to align a substrate (e.g., substrate W) with respect to a patterning device (e.g., patterning device MA). Metrology system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, metrology system 400 may include an illumination system 412, a reflector 414, an interferometer 426, a detector 428, and a controller 430, according an example of this embodiment. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

Reflector 414 may be configured to receive radiation beam 413 and direct radiation beam 413 towards substrate 420 as beam 415, according an embodiment. Reflector 414 may be a mirror or dichromatic mirror. In one example, stage 422 is moveable along direction 424. Radiation beam 415 may be configured to illuminate an alignment mark or a target 418 located on substrate 420. In another example, radiation beam 415 is configured to reflect from a surface of substrate 420. Alignment mark or target 418 may be coated with a radiation sensitive film in an example of this embodiment. In another example, alignment mark or target 418 may have one hundred and eighty degree symmetry. That is, when alignment mark or target 418 is rotated one hundred and eighty degrees about an axis of symmetry perpendicular to a plane of alignment mark or target 418, rotated alignment mark or target 418 may be substantially identical to an un-rotated alignment mark or target 418.

As illustrated in FIG. 4, interferometer 426 may be configured to receive radiation beam 417. A radiation beam 419 may be diffracted from an alignment mark or target 418, or reflected from a surface of substrate 420, and is received at interferometer 426 as radiation beam 417. Interferometer 426 comprises any appropriate set of optical-elements, for example, a combination of prisms that may be configured to form two images of alignment mark or target 418 based on the received radiation beam 417. It should be appreciated that a good quality image need not be formed, but that the features of alignment mark 418 should be resolved. Interferometer 426 may be further configured to rotate one of the two images with respect to the other of the two images one hundred and eighty degrees and recombine the two images interferometrically.

In an embodiment, detector 428 may be configured to receive the recombined image and detect an interference as a result of the recombined image when alignment axis 421 of metrology system 400 passes through a center of symmetry (not shown) of alignment mark or target 418. Such interference may be due to alignment mark or target 418 being one hundred and eighty degree symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. In another example, detector 428 is configured to receive the recombined image and detect an interference of light being reflected off a surface of substrate 420.

In a further embodiment, controller 430 may be configured to receive signal 429 including information of the determined center of symmetry. Controller 430 may be further configured to determine a position of stage 422 and correlate the position of stage 422 with the position of the center of symmetry of alignment mark or target 418. As such, the position of alignment mark or target 418 and consequently, the position of substrate 420 may be accurately known with reference to stage 422. Alternatively, controller 430 may be configured to determine a position of metrology system 400 or any other reference element such that the center of symmetry of alignment mark or target 418 may be known with reference to metrology system 400 or any other reference element.

In an embodiment, controller 430 is configured to apply a correction to a measurement received from detector 428 to account for asymmetry that can exist in alignment mark or target 418. The asymmetry can exist due to imperfections in the structure of the mark itself (sidewall angle, critical dimension spacing, etc.) or due to non-linear optical effects based on the wavelength of light being directed towards alignment mark or target 418.

It should be noted that even though reflector 414 is shown to direct radiation beam 413 towards alignment mark or target 418 as radiation beam 415, the disclosure is not so limiting. It would be apparent to a person skilled in the relevant art that other optical arrangements may be used to obtain the similar result of illuminating alignment mark or target 418 on substrate 420 and detecting an image of alignment mark or target 418. Reflector 414 may direct the illumination in a direction normal to the surface of substrate 420, or at an angle.

Adaptive Substrate Alignment

As noted above, a correction may be applied to measurements taken from metrology system 400 to account for mark asymmetry. In traditional modelling, measured data is entered in equations with the values weighted and added up to produce a wanted outcome—outcomes that most often necessitate feed-back information. For example, mark positions are measured using all colors (i.e., range of excitation wavelengths) and polarizations separately from one another and the algorithm optimizes the weight that should be applied to the measured mark positions to predict de-corrected overlay. Thus the traditional approach is based on the assumption that mark asymmetry (and other effects) is compromising the quality of the measured data. According to an embodiment, one solution discussed herein is to use the compromised data, i.e. apply optimal color weights to the measured mark positions, to correct for the unwanted effects captured in them. The approach is based on data decomposition where the measured data is divided up into individual contributing components then recomposed, but with omitting the unwanted contributing components, such as the contribution from mark asymmetry.

The measured data from an alignment mark can be decomposed into various components as shown below in equation (1):

$$AP_{measured} = AP_{common} + AP_{asymmetry} + AP_{other} \tag{1}$$

Where $AP_{measured}$ is measured data, $AP_{common}$ is the component of the measured data due to the common term in all mark due to wafer deformation, $AP_{asymmetry}$ is the component of the measured data due to mark asymmetry, and $AP_{other}$ is the component of the measured data caused by any other factors. According to an embodiment, the goal is to find the solution for $AP_{asymmetry}$ so that $AP_{asymmetry}$ can then be subtracted from $AP_{measured}$ to obtain the correct alignment position.

The component of the measured data due to the correct alignment position (AP) can be obtained as:

$$AP = AP_{measured} - AP_{asymmetry} \tag{2}$$

Figure 5:
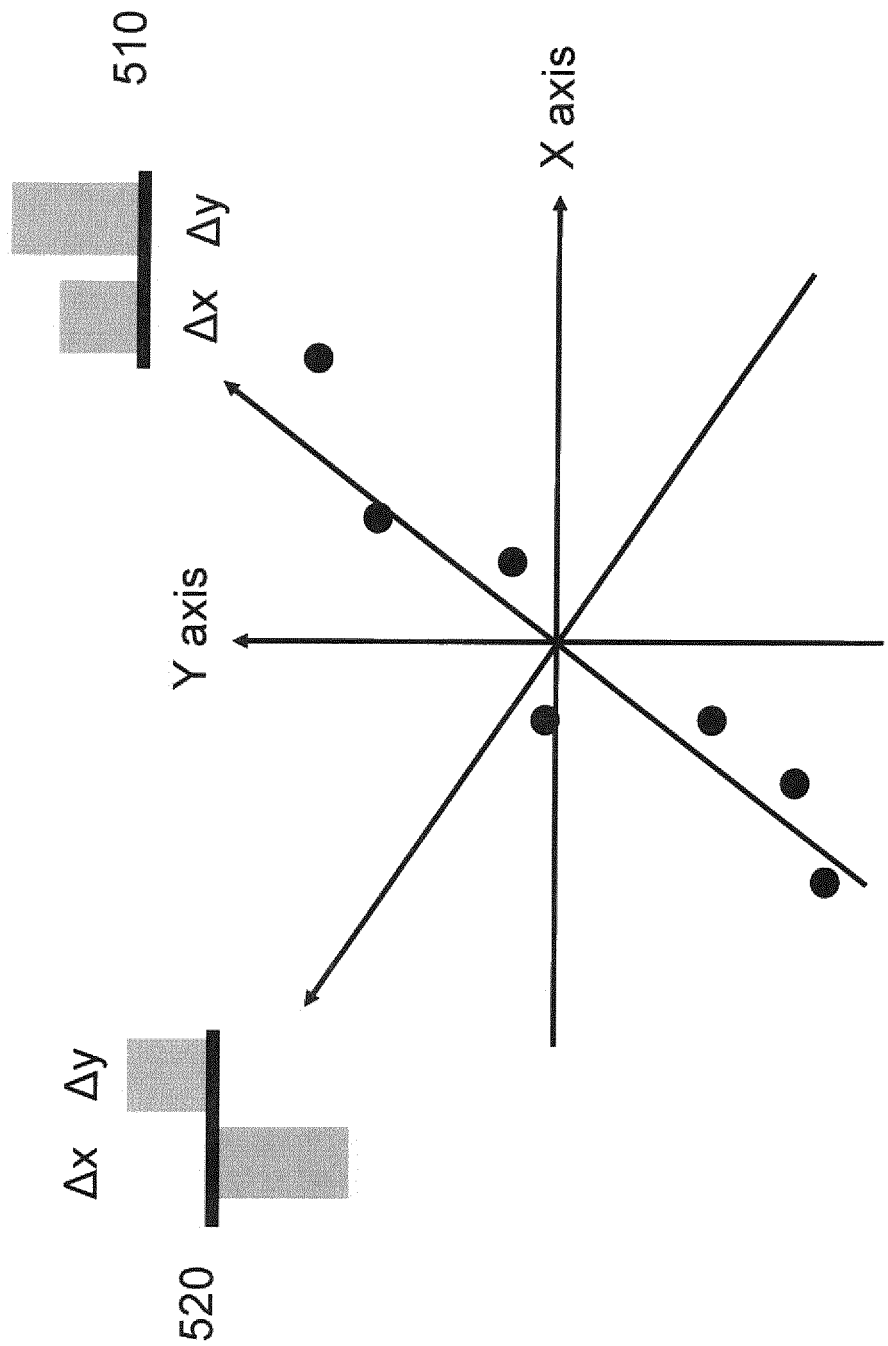
FIG. 5 is a schematic for characterizing measured data, according to an embodiment.

The deconstructed components of the measured data can be organized into an orthogonal model, represented algebraically by equation (3), and illustrated in FIG. 5.

$$AP_{common} + AP_{asymmetry} + AP_{other} = USV^T \tag{3}$$

The X axis and Y axis in the orthogonal subspace can each represent a different wavelength or range of wavelengths (i.e. color) of incident light used to measure the position of the alignment mark. Although only two colors are illustrated here for convenience, there may be any number of colors and/or polarizations used to characterize the orthogonal subspace of the measured data. The measured data can be plotted, and a first principal component vector 510 and a second principal component vector 520 can be determined. According to an embodiment, the first principal component vector 510 provides the slope that best represents the data and the second principal component vector 520 is orthogonal to the first principal component vector. The x and y contributions to the slope of each of the first and second principal components are illustrated using bar graphs next to each of the component vectors. According to an embodiment, the first and second principal component vectors define a new orthogonal subspace for characterizing the measured data.

Figure 6:
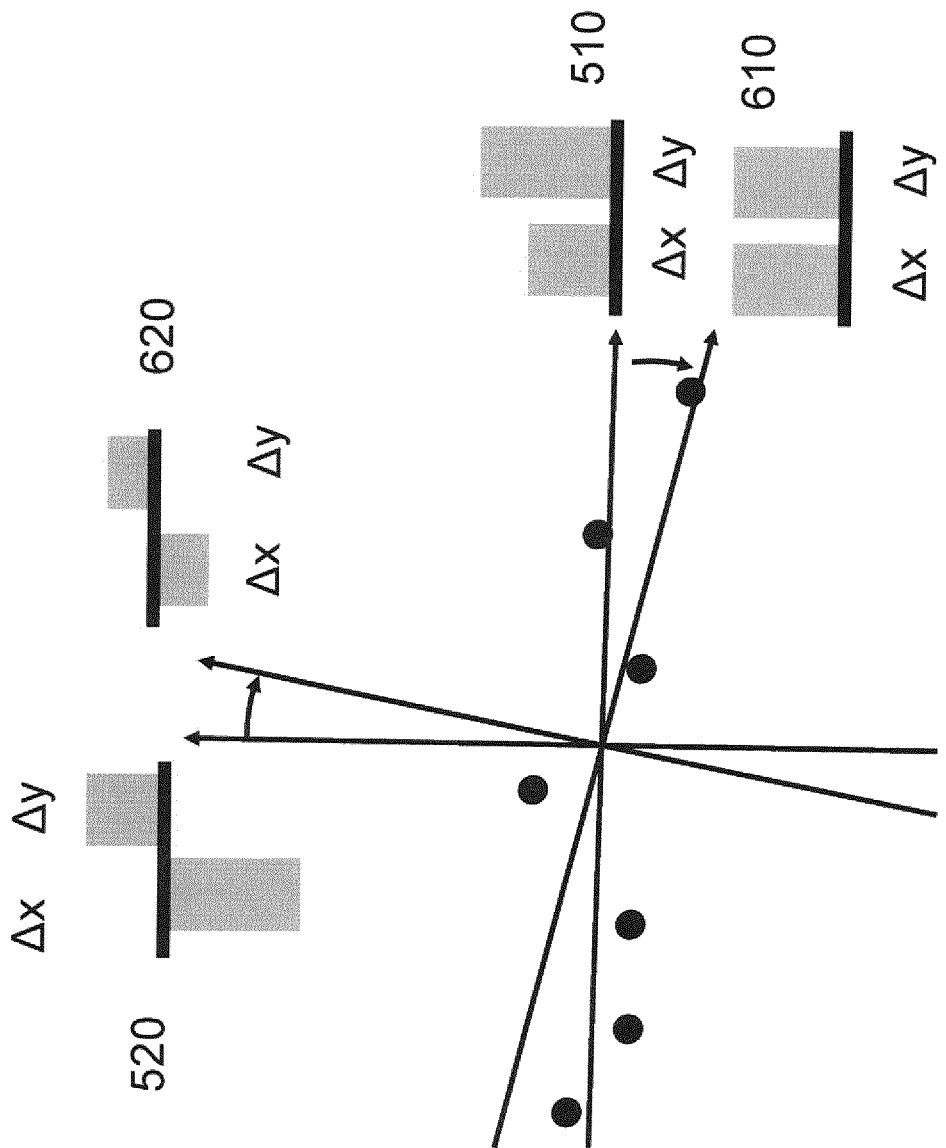
FIG. 6 is another schematic for characterizing measured data, according to an embodiment.

The new orthogonal subspace is then rotated to generate a first factor vector 610 and a second factor vector 620 orthogonal to the first factor vector 610 as illustrated in FIG. 6, according to an embodiment. The x and y contributions to the slope of each of the first factor vector 610 and the second factor vector 620 are illustrated using bar graphs next to each of the first factor vector 610 and the second factor vector 620. The rotation of the orthogonal subspace may be performed to attribute equal weight to all wavelengths used during the measurement of the alignment mark (i.e., colors.) In this way, a similar substrate deformation is defined for all colors.

Figure 7:
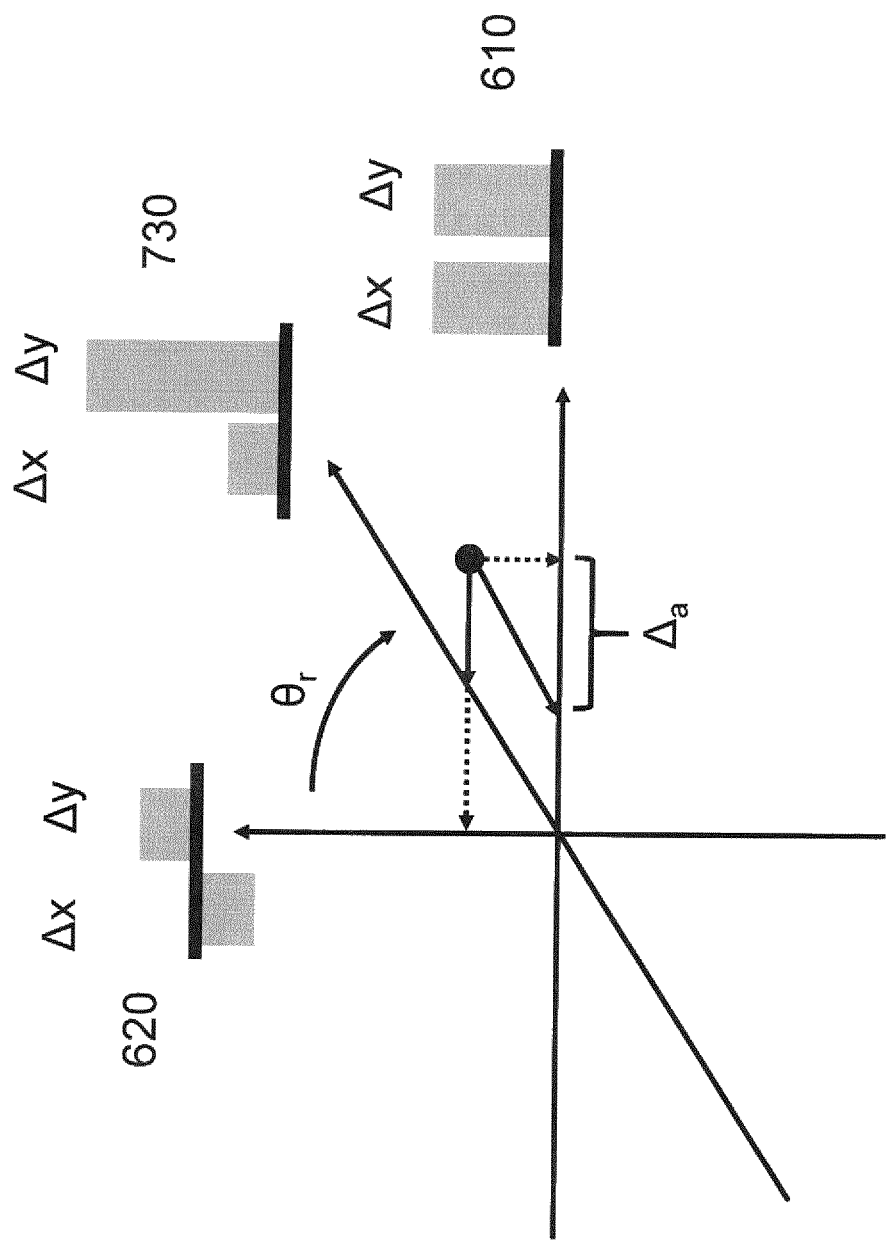
FIG. 7 is another schematic for characterizing measured data, according to an embodiment.

According to an embodiment, the second factor vector 620 of the rotated orthogonal subspace is further rotated by a given angle $\theta_r$ to generate a new asymmetry vector 730 as illustrated in FIG. 7. A non-orthogonal subspace can be generated based on the asymmetry vector 730 and the first factor vector 610. Contributions in the measured data due to mark asymmetry can be determined using the non-orthogonal subspace. As shown in FIG. 7, the projection of the measurement onto the first factor vector 610 and the second factor vector 620 (orthogonal subspace) is shown using dotted arrows and the projection of the measurement onto the first factor vector 610 and the asymmetry vector 730 (non-orthogonal subspace) is shown using solid arrows. The contribution of the first factor vector 610 is decreased by $\Delta_a$ in the non-orthogonal subspace as compared to the orthogonal subspace.

According to an embodiment, adaptive alignment can include finding the part of asymmetry that resides in the common term by adding a potential average to the asymmetry contribution. The potential average can be determined as an orthogonal projection of the first vector factor 610 on the score space spanned by the asymmetry term.

There are many possible rotation angles $\theta_r$ that can be used to generate the new asymmetry vector 730. The rotation angle $\theta_r$ can be any value between −90 degrees and +90 degrees.

Figure 8:
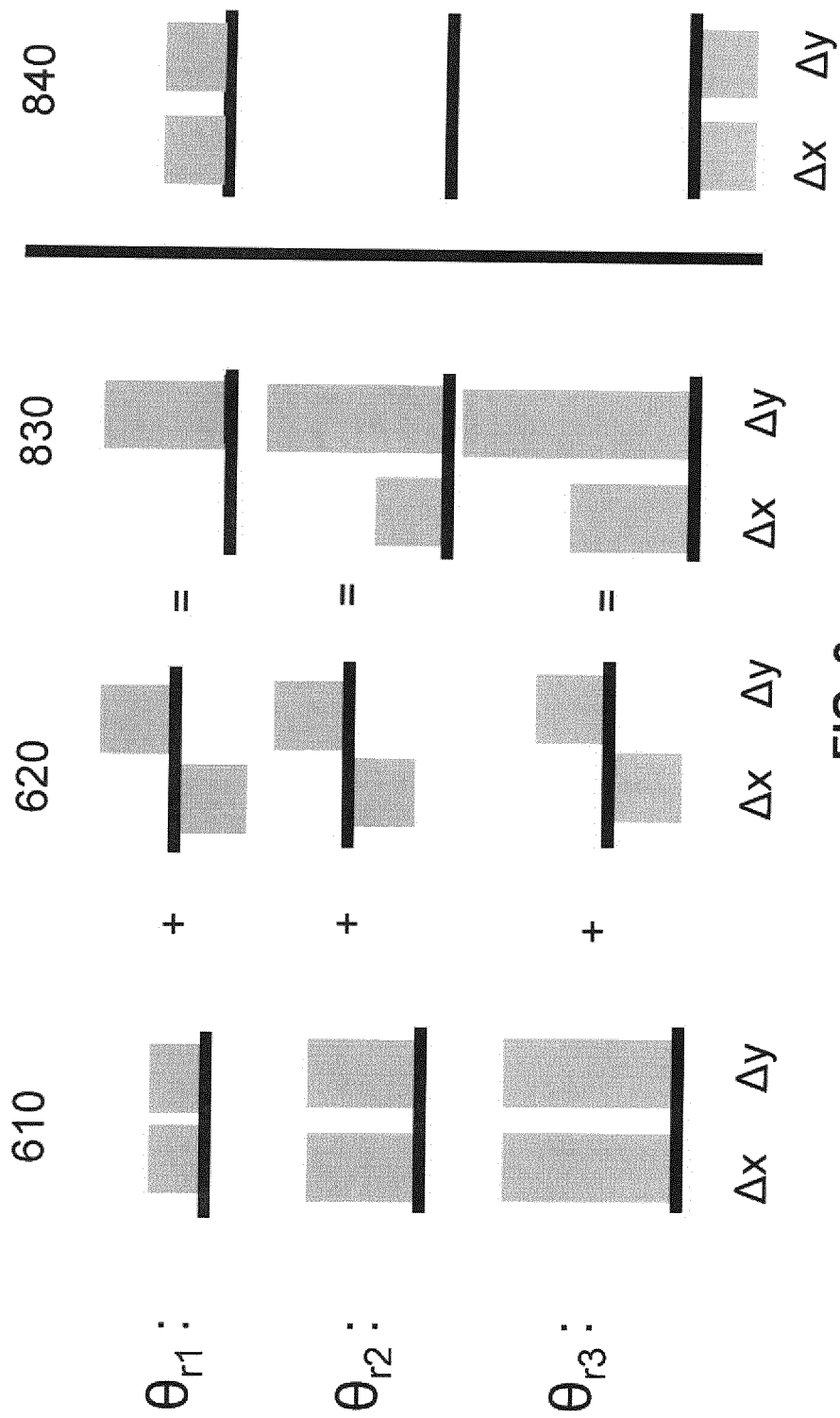
FIG. 8 is another schematic for characterizing different possible sets of measured data, according to some embodiments.

According to an embodiment, the asymmetry vector 730 is a linear combination of the first factor vector 610 and the second factor vector 620. Various possible asymmetry vectors 830 are determined, and the asymmetry vector 730 determined by the optimal rotation angle $\theta_r$ is the correct vector to use. The optimal rotation angle is defined as the angle that minimizes the contribution of the first factor vector 610 (the pure AP term). For example, FIG. 8 illustrates three possible asymmetry vectors 830 formed from three different rotation angles of the second factor vector 620—$\theta_{r1}$, $\theta_{r2}$, and $\theta_{r3}$. The asymmetry vectors 830 generated by the rotation of the second factor vector 620 by either $\theta_{r1}$ or $\theta_{r3}$ yield residual vectors 840 having x and y components. However, the asymmetry vector 730 generated by the rotation of the second factor vector 620 by $\theta_{r2}$ yields no residual vector, thus making it the best choice to use for representing the asymmetry of the measured mark. This determination of the asymmetry vector 730 can also be represented algebraically by the following equations:

$$USV^T = CA^T \tag{4}$$

$$CA^T = C_1 A_1^T + C_2 A_2^T \tag{5}$$

THUS:

$$AP_{common} = C_1 A_1^T \tag{6}$$

$$AP_{asymmetry} = C_2 A_2^T \tag{7}$$

$$AP_{other} = AP_{measured} - AP_{common} - AP_{asymmetry} \tag{8}$$

Once the optimal $AP_{asymmetry}$ vector has been determined, it can merely be subtracted from the measurement measured to $AP_{measured}$ to yield the corrected measurement due to the true mark position/shape AP as shown below in equation (8).

$$AP = AP_{measured} - AP_{asymmetry} \tag{8}$$

Figure 9:
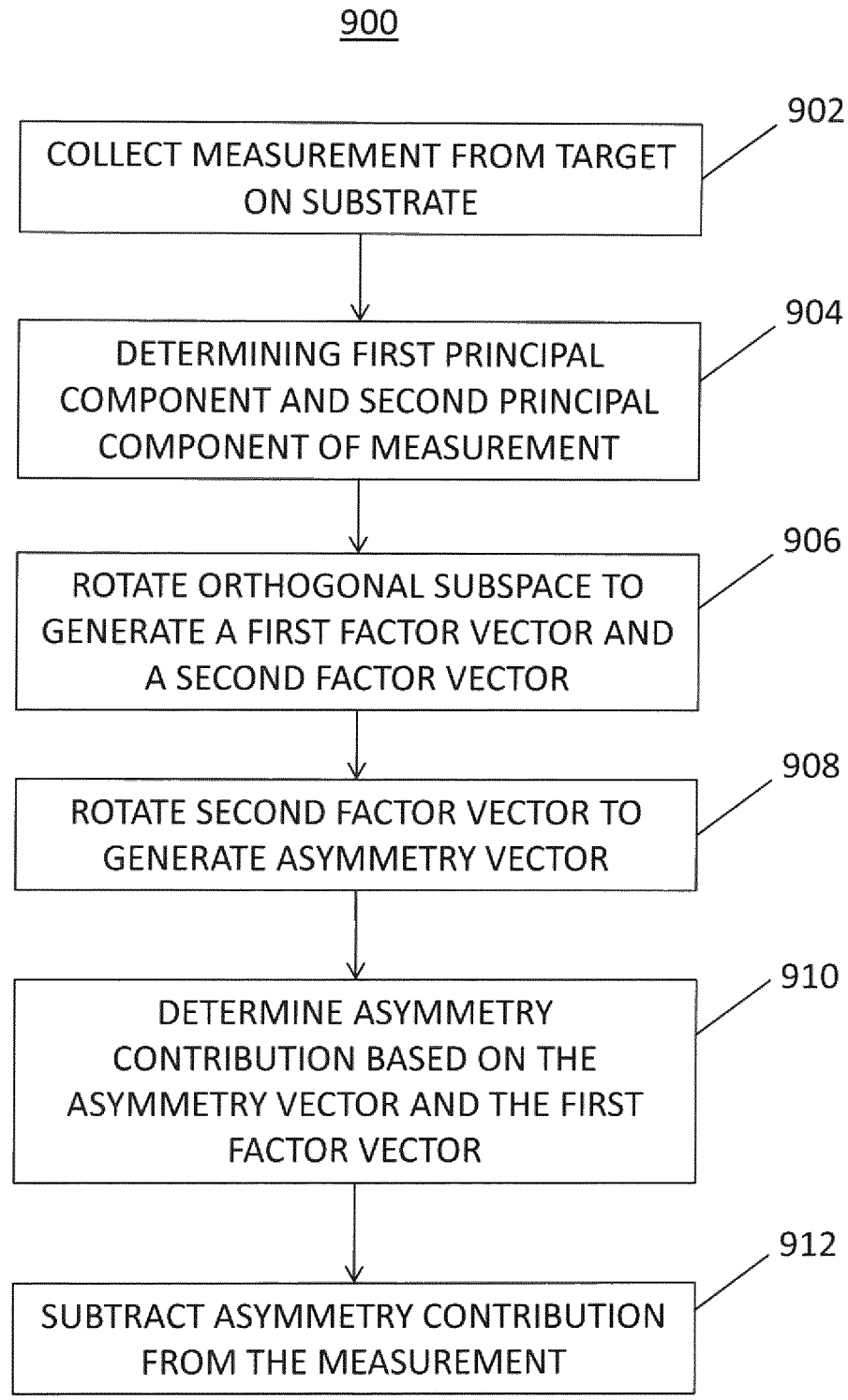
FIG. 9 is an example flowchart of operations performed to reduce asymmetry contributions in measured data, according to an embodiment.

FIG. 9 is a flowchart of an exemplary method 900 of correcting alignment mark asymmetry from received measurement of the alignment mark, according to some embodiments. It should be understood that the operations shown in method 900 are not exhaustive and that other operations can be performed as well before, after, or between any of the illustrated operations. In various embodiments of the present disclosure, the operations of method 900 can be performed in a different order and/or vary.

In operation 902, an optical measurement is collected from an alignment target on a substrate. The alignment target can be a grating structure having lines of a given width and thickness. The alignment mark on the target can be illuminated using light having a wavelength range between 500 nm and 900 nm.

In operation 904, a controller is used to determine a first principal component vector of the measurement and a second principal component vector of the measurement. The first and second principal component vectors can be determined on an X-axis/Y-axis plot of the measurement. According to some embodiments, the first principal component vector provides the slope that best represents the data and the second principal component vector is orthogonal to the first principal component vector. The first and second principal component vectors define an orthogonal subspace for characterizing the measurement, according to some embodiments.

In operation 906, the controller rotates the orthogonal subspace defined by the first and second principal component vectors to generate first and second factor vectors, respectively. That is, the second factor vector is orthogonal to the first factor vector in the rotated orthogonal subspace.

In operation 908, the second factor vector is rotated by a given angle to form an asymmetry vector. The asymmetry vector forms a non-orthogonal subspace with the first factor vector. The second factor vector can be rotated between −90 degrees and +90 degrees. Different rotations of the second factor vector generate different asymmetry vectors and each can be tested to determine which asymmetry vector best represents the actual mark asymmetry.

In operation 910, the contribution to the measurement caused by asymmetry of the alignment mark is determined. The optimal asymmetry vector is determined by the optimal rotation of the second factor vector in operation 908. The optimal rotation is defined as the rotation angle that minimizes the contribution of the 1$^{st}$ factor vector (the pure AP term).

In operation 912, the asymmetry contribution determined in operation 910 is subtracted from the measurement. Removing the asymmetry contribution yields the corrected position of the alignment mark.

It should be noted that the analysis described herein is directed to determining a single asymmetry vector for clarity, but any number of asymmetry vectors can be derived along the decomposition of the measured signal. Furthermore, the decomposition of the measured data, and subsequent analysis of the decomposed components, can be used for other applications beyond correcting alignment position. For example, this information may be used as a diagnostic tool to determine which colors are best suited for a given alignment situation.

According to some embodiments, the methods described herein may be used to also correct for non-asymmetry related alignment errors. For example, the methods described herein can correct for systemic optical module errors.

The embodiments may further be described using the following clauses:

1. A metrology system, comprising:
    a radiation source configured to generate light;
    a reflector configured to direct the light towards a substrate;
    an interferometer configured to receive light diffracted from a pattern on the substrate, or reflected from the substrate, and to produce output light from the interference between the diffracted or reflected light;
    a detector configured to receive the output light from the interferometer and to produce a measurement based on the received output light; and
    a controller configured to determine a correction to the measurement, wherein determining the correction comprises:
        determining an orthogonal subspace used to characterize a first principal component of the measurement and a second principal component of the measurement;
        rotating the orthogonal subspace by a first angle such that the first principle component rotates to become a first factor vector and the second principle component rotates to become a second factor vector;
        generating an asymmetry vector by rotating the second factor vector by a second angle, wherein the asymmetry vector and the first factor vector define a non-orthogonal subspace;
        determining an asymmetry contribution in the measurement based on the projection of the measurement onto the first factor vector in the non-orthogonal subspace; and
        subtracting the asymmetry contribution from the measurement.

2. The metrology system of clause 1, wherein the second principle component is orthogonal to the first principle component.

3. The metrology system of clause 1, wherein the second factor vector is orthogonal to the first factor vector.

4. The metrology system of clause 1, wherein the asymmetry vector is a linear combination of the first factor vector and the second factor vector.

5. The metrology system of clause 1, wherein the light generated by the radiation source has a wavelength range between 500 nm and 900 nm.

6. The metrology system of clause 1, wherein the controller is further configured to decompose the measurement into a desired measurement contribution, the asymmetry contribution, and a residual contribution.

7. The metrology system of clause 6, wherein the controller is configured to determine the asymmetry contribution by determining which second angle of the asymmetry vector minimizes the contribution of the first factor vector to the measurement.

8. A lithographic apparatus, comprising:
    an illumination system configured to illuminate a pattern of a patterning device;
    a projection system configured to project an image of the pattern onto a target portion of a substrate; and
    a metrology system comprising:
        a radiation source configured to generate light;
        a reflector configured to direct the light towards a substrate;
        an interferometer configured to receive light that has been diffracted from a pattern on the substrate, or reflected from the substrate, and to produce output light from the interference between the diffracted or reflected light;
        a detector configured to receive the output light from the interferometer and to produce a measurement based on the received output light; and
        a controller configured to determine a correction to the measurement, wherein determining the correction comprises:
            determining an orthogonal subspace used to characterize a first principal component of the measurement and a second principal component of the measurement;
            rotating the orthogonal subspace by a first angle such that the first principle component rotates to become a first factor vector and the second principle component rotates to become a second factor vector;
            generating an asymmetry vector by rotating the second factor vector by a second angle, wherein the asymmetry vector and the first factor vector define a non-orthogonal subspace;

determining an asymmetry contribution in the measurement based on the projection of the measurement onto the first factor vector in the non-orthogonal subspace; and subtracting the asymmetry contribution from the measurement.

9. The lithographic apparatus of clause 8, wherein the second principle component is orthogonal to the first principle component.

10. The lithographic apparatus of clause 8, wherein the second factor vector is orthogonal to the first factor vector.

11. The lithographic apparatus of clause 8, wherein the asymmetry vector is a linear combination of the first factor vector and the second factor vector.

12. The lithographic apparatus of clause 8, wherein the light generated by the radiation source has a wavelength range between 500 nm and 900 nm.

13. The lithographic apparatus of clause 8, wherein the controller is further configured to decompose the measurement into a desired measurement contribution, the asymmetry contribution, and a residual contribution.

14. The lithographic apparatus of clause 13, wherein the controller is configured to determine the asymmetry contribution by determining which second angle of the asymmetry vector minimizes the contribution of the first factor vector to the measurement.

15. A method of applying a correction to a measurement determined by a metrology system in order to account for asymmetry of a measured pattern, the method comprising:

determining an orthogonal subspace used to characterize a first principal component of the measurement and a second principal component of the measurement;

rotating the orthogonal subspace by a first angle such that the first principle component rotates to become a first factor vector and the second principle component rotates to become a second factor vector;

generating an asymmetry vector by rotating the second factor vector by a second angle, wherein the asymmetry vector and the first factor vector define a non-orthogonal subspace;

determining an asymmetry contribution in the measurement based on the projection of the measurement onto the first factor vector in the non-orthogonal subspace; and subtracting the asymmetry contribution from the measurement.

16. The method of clause 15, wherein the second principle component is orthogonal to the first principle component.

17. The method of clause 15, wherein the second factor vector is orthogonal to the first factor vector.

18. The method of clause 15, wherein the asymmetry vector is a linear combination of the first factor vector and the second factor vector.

19. The method of clause 15, further comprising decomposing the measurement into a desired measurement contribution, the asymmetry contribution, and a residual contribution.

20. The method of clause 19, wherein determining the asymmetry contribution further comprises determining which second angle of the asymmetry vector minimizes the contribution of the first factor vector to the measurement.

Example Hardware Environment

Figure 10:
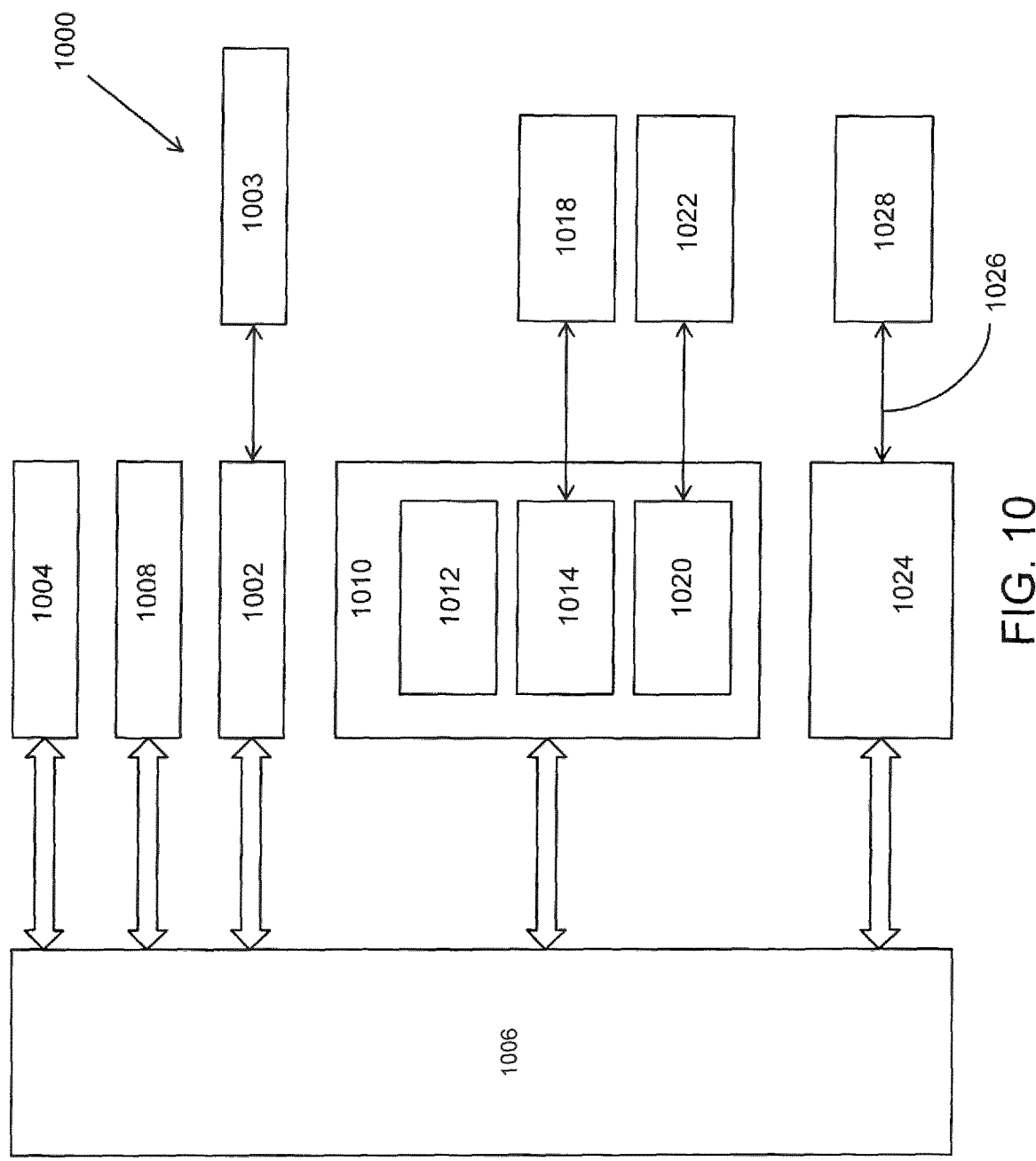
FIG. 10 is an example computer system useful for implementing various embodiments.

Various embodiments described herein of correcting alignment overlay measurements can be implemented, for example, using one or more well-known computer systems, such as computer system 1000 shown in FIG. 10. Computer system 1000 can be any well-known computer capable of performing the functions described herein, such as computers available from International Business Machines, Apple, Sun, HP, Dell, Sony, Toshiba, etc. In one example, computer system 1000 represents controller 430. In another example, controller 430 is represented by a processor 1004 of computer system 1000. Computer system 1000 may be configured to perform any of operations 902-912 of method 900, according to some embodiments.

Computer system 1000 includes one or more processors (also called central processing units, or CPUs), such as processor 1004. Processor 1004 is connected to a communication infrastructure or bus 1006.

One or more processors 1004 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1000 also includes user input/output device(s) 1003, such as monitors, keyboards, pointing devices, etc., which communicate with communication infrastructure 1006 through user input/output interface(s) 1002.

Computer system 1000 also includes a main or primary memory 1008, such as random access memory (RAM). Main memory 1008 may include one or more levels of cache. Main memory 1008 has stored therein control logic (i.e., computer software) and/or data. In an embodiment, at least main memory 1008 may be implemented and/or function as described herein.

Computer system 1000 may also include one or more secondary storage devices or memory 1010. Secondary memory 1010 may include, for example, a hard disk drive 1012 and/or a removable storage device or drive 1014. Removable storage drive 1014 may be a floppy disk drive, a magnetic tape drive, a compact disk drive, an optical storage device, tape backup device, and/or any other storage device/drive.

Removable storage drive 1014 may interact with a removable storage unit 1018. Removable storage unit 1018 includes a computer usable or readable storage device having stored thereon computer software (control logic) and/or data. Removable storage unit 1018 may be a floppy disk, magnetic tape, compact disk, DVD, optical storage disk, and/ any other computer data storage device. Removable storage drive 1014 reads from and/or writes to removable storage unit 1018 in a well-known manner.

According to an exemplary embodiment, secondary memory 1010 may include other means, instrumentalities or other approaches for allowing computer programs and/or other instructions and/or data to be accessed by computer system 1000. Such means, instrumentalities or other approaches may include, for example, a removable storage unit 1022 and an interface 1020. Examples of the removable storage unit 1022 and the interface 1020 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1000 may further include a communication or network interface 1024. Communication interface 1024 enables computer system 1000 to communicate and interact with any combination of remote devices, remote networks, remote entities, etc. (individually and collectively referenced by reference number 1028). For example, communication interface 1024 may allow computer system 1000 to communicate with remote devices 1028 over communications path 1026, which may be wired and/or wireless, and which may include any combination of LANs, WANs, the Internet, etc. Control logic and/or data may be transmitted to and from computer system 1000 via communication path 1026.

In an embodiment, a tangible apparatus or article of manufacture comprising a tangible computer useable or readable medium having control logic (software) stored thereon is also referred to herein as a computer program product or program storage device. This includes, but is not limited to, computer system 1000, main memory 1008, secondary memory 1010, and removable storage units 1018 and 1022, as well as tangible articles of manufacture embodying any combination of the foregoing. Such control logic, when executed by one or more data processing devices (such as computer system 1000), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 10. In particular, embodiments may operate with software, hardware, and/or operating system implementations other than those described herein.

Final Remarks

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A metrology system, comprising:
a radiation source configured to generate light;
a reflector configured to direct the light towards a substrate;
an interferometer configured to receive light diffracted from a pattern on the substrate, or reflected from the substrate, and to produce output light from the interference between the diffracted or reflected light;
a detector configured to receive the output light from the interferometer and to produce a measurement based on the received output light; and
a controller configured to determine a correction to the measurement, wherein determining the correction comprises:
determining an orthogonal subspace used to characterize a first principal component of the measurement and a second principal component of the measurement;
rotating the orthogonal subspace by a first angle such that the first principle component rotates to become a first factor vector and the second principle component rotates to become a second factor vector;
generating an asymmetry vector by rotating the second factor vector by a second angle, wherein the asymmetry vector and the first factor vector define a non-orthogonal subspace;
determining an asymmetry contribution in the measurement based on the projection of the measurement onto the first factor vector in the non-orthogonal subspace; and
subtracting the asymmetry contribution from the measurement.

2. The metrology system of claim 1, wherein the second principle component is orthogonal to the first principle component.

3. The metrology system of claim 1, wherein the second factor vector is orthogonal to the first factor vector.

4. The metrology system of claim 1, wherein the asymmetry vector is a linear combination of the first factor vector and the second factor vector.

5. The metrology system of claim 1, wherein the light generated by the radiation source has a wavelength range between 500 nm and 900 nm.

6. The metrology system of claim 1, wherein the controller is further configured to decompose the measurement into a desired measurement contribution, the asymmetry contribution, and a residual contribution.

7. The metrology system of claim 6, wherein the controller is configured to determine the asymmetry contribution by determining which second angle of the asymmetry vector minimizes the contribution of the first factor vector to the measurement.

8. A lithographic apparatus, comprising:
an illumination system configured to illuminate a pattern of a patterning device;
a projection system configured to project an image of the pattern onto a target portion of a substrate; and
a metrology system comprising:
a radiation source configured to generate light;
a reflector configured to direct the light towards a substrate;
an interferometer configured to receive light that has been diffracted from a pattern on the substrate, or reflected from the substrate, and to produce output light from the interference between the diffracted or reflected light;
a detector configured to receive the output light from the interferometer and to produce a measurement based on the received output light; and
a controller configured to determine a correction to the measurement, wherein determining the correction comprises:
determining an orthogonal subspace used to characterize a first principal component of the measurement and a second principal component of the measurement;
rotating the orthogonal subspace by a first angle such that the first principle component rotates to become a first factor vector and the second principle component rotates to become a second factor vector;
generating an asymmetry vector by rotating the second factor vector by a second angle, wherein the asymmetry vector and the first factor vector define a non-orthogonal subspace;
determining an asymmetry contribution in the measurement based on the projection of the measurement onto the first factor vector in the non-orthogonal subspace; and
subtracting the asymmetry contribution from the measurement.

9. The lithographic apparatus of claim 8, wherein the second principle component is orthogonal to the first principle component.

10. The lithographic apparatus of claim 8, wherein the second factor vector is orthogonal to the first factor vector.

11. The lithographic apparatus of claim 8, wherein the asymmetry vector is a linear combination of the first factor vector and the second factor vector.

12. The lithographic apparatus of claim 8, wherein the light generated by the radiation source has a wavelength range between 500 nm and 900 nm.

13. The lithographic apparatus of claim 8, wherein the controller is further configured to decompose the measurement into a desired measurement contribution, the asymmetry contribution, and a residual contribution.

14. The lithographic apparatus of claim 13, wherein the controller is configured to determine the asymmetry contribution by determining which second angle of the asymmetry vector minimizes the contribution of the first factor vector to the measurement.

15. A method of applying a correction to a measurement determined by a metrology system in order to account for asymmetry of a measured pattern on a substrate, the method comprising:
receiving a measurement that is based on output light produced from an interference between light diffracted from an alignment pattern on the substrate and light reflected from the substrate;
determining an orthogonal subspace used to characterize a first principal component of the measurement and a second principal component of the measurement;
rotating the orthogonal subspace by a first angle such that the first principle component rotates to become a first factor vector and the second principle component rotates to become a second factor vector;

generating an asymmetry vector by rotating the second factor vector by a second angle, wherein the asymmetry vector and the first factor vector define a non-orthogonal subspace;

determining an asymmetry contribution in the measurement based on the projection of the measurement onto the first factor vector in the non-orthogonal subspace; and subtracting the asymmetry contribution from the measurement to yield a corrected measurement;

determining a corrected position of the alignment pattern on the substrate based on the corrected measurement; and aligning the substrate using the corrected position of the alignment pattern.

16. The method of claim 15, wherein the second principle component is orthogonal to the first principle component.

17. The method of claim 15, wherein the second factor vector is orthogonal to the first factor vector.

18. The method of claim 15, wherein the asymmetry vector is a linear combination of the first factor vector and the second factor vector.

19. The method of claim 15, further comprising decomposing the measurement into a desired measurement contribution, the asymmetry contribution, and a residual contribution.

20. The method of claim 19, wherein determining the asymmetry contribution further comprises determining which second angle of the asymmetry vector minimizes the contribution of the first factor vector to the measurement.

21. The method of claim 15, wherein the alignment pattern is an alignment target on the substrate.

* * * * *